(12) United States Patent
Zhang et al.

(10) Patent No.: US 8,501,593 B2
(45) Date of Patent: Aug. 6, 2013

(54) METHOD OF NISIGE EPITAXIAL GROWTH BY INTRODUCING AL INTERLAYER

(75) Inventors: Miao Zhang, Shanghai (CN); Bo Zhang, Shanghai (CN); Zhongying Xue, Shanghai (CN); Xi Wang, Shanghai (CN)

(73) Assignee: Shanghai Institute of Microsystem and Information Technology, Chinese Academy of Sciences, Shanghai (CN)

(*) Notice: Subject to any disclaimer, the term of this patent is extended or adjusted under 35 U.S.C. 154(b) by 0 days.

(21) Appl. No.: 13/260,757

(22) PCT Filed: Jul. 25, 2011

(86) PCT No.: PCT/CN2011/077528
§ 371 (c)(1),
(2), (4) Date: Sep. 28, 2011

(87) PCT Pub. No.: WO2012/058947
PCT Pub. Date: May 10, 2012

(65) Prior Publication Data
US 2012/0129320 A1    May 24, 2012

(30) Foreign Application Priority Data
Nov. 4, 2010  (CN) .......................... 2010 1 0532645

(51) Int. Cl.
*H01L 27/092* (2006.01)
(52) U.S. Cl.
USPC ...................... 438/478; 438/199; 257/E21.09

(58) Field of Classification Search
USPC ........................................................ 438/478
See application file for complete search history.

(56) References Cited

U.S. PATENT DOCUMENTS

| 5,782,997 A | 7/1998 | Cho et al. |
| 2005/0059242 A1 | 3/2005 | Cabral, Jr. et al. |
| 2010/0022073 A1* | 1/2010 | Fitzgerald et al. ............ 438/478 |

FOREIGN PATENT DOCUMENTS
CN          101452832 A    6/2009

OTHER PUBLICATIONS

Sinha et al., "Contact Resistance Reduction Technology Using Aluminum Implant and Segregation for Strained p-FinFETs With Silicon-Germanium Source/Drain", Jun. 2010, IEEE Transactions on Electron Devices, vol. 57, No. 6, pp. 1279-1286.*
Foreign priority CN201010532645.1 Filing date: Nov. 4, 2010 pp. 1-11.*
International Search Report in corresponding PCT Application No. PCT/CN2011/077528 issued on Oct. 27, 2011.

* cited by examiner

*Primary Examiner* — Telly Green
*Assistant Examiner* — Damian A Hillman
(74) *Attorney, Agent, or Firm* — MKG, LLC

(57) ABSTRACT

The present invention discloses a method of NiSiGe epitaxial growth by introducing Al interlayer, comprising the deposition of an Al thin film on the surface of SiGe layer, subsequent deposition of a Ni layer on Al thin film and then the annealing process for the reaction between Ni layer and SiGe material of SiGe layer to form NiSiGe material. Due to the barrier effect of Al interlayer, NiSiGe layer features a single crystal structure, a flat interface with SiGe substrate and a thickness of up to 0.3 nm, significantly enhancing interface performance.

8 Claims, 2 Drawing Sheets

METHOD OF NISIGE EPITAXIAL GROWTH BY INTRODUCING AL INTERLAYER

FIELD OF THE INVENTION

The present invention relates to a fabrication process of transistor, and more particularly to a method of fabricating transistor source and drain in fabrication process, belonging to semiconductor manufacturing field.

BACKGROUND OF THE INVENTION

In source and drain regions of conventional transistor, semiconductor and metal electrode directly contact with each other, resulting in high contact resistance and high Schottky barrier and thereby affecting device performance. Nickel (Ni) and silicon (Si) can react to form NiSi silicide as contact material, greatly reducing contact resistance and Schottky barrier and enjoying wide use. At present, NiSi has been used as contact material for source and drain of metal-oxide-semiconductor field-effect transistor (MOSFET) manufactured by Intel, AMD and so on.

With the development of semiconductor technology, SiGe, a kind of novel high-mobility material, is an ideal substitute for Si material in the future. However, during the reaction between Ni and SiGe to produce silicide, the presence of germanium (Ge) atoms is likely to cause different reaction sequence of Ni with Si and Ge atoms, making it difficult to form continuous NiSiGe thin film. Moreover, the diffusion of Ge can cause poor electrical performance of the formed NiSiGe thin film, affecting NiSiGe thin film as source and drain contact to a great extent.

Therefore, the present invention will provide a new method of NiSiGe growth using an aluminum (Al) interlayer to prevent the diffusion of Ge atoms, thereby forming epitaxial NiSiGe thin film of high quality.

SUMMARY OF THE INVENTION

The technical problem to be solved in the present invention is to provide a method of NiSiGe epitaxial growth by introducing Al interlayer.

In order to solve the foregoing technical problem, the present invention adopts the following technical scheme:

A method of NiSiGe epitaxial growth by introducing Al interlayer, comprising the following steps:

Step 1, form a SiGe layer on a semiconductor Si substrate;

Step 2, clean SiGe layer to remove contaminants and native oxide from surface;

Step 3, deposit an Al thin film on the surface of SiGe layer;

Step 4, deposit a Ni layer on Al thin film;

Step 5, perform annealing process for the reaction between Ni layer and SiGe material of SiGe layer to form NiSiGe material;

Step 6, remove unreacted Ni1 by selective etch to get a NiSiGe epitaxial layer on the surface of SiGe layer.

As a preferable scheme of the present invention, said SiGe layer is directly formed on Si substrate to form SiGe layer with compressive stress, or be grown using buffer layer process to form relaxed SiGe layer.

As a preferable scheme of the present invention, SiGe layer employs $Si_xGe_{1-x}$ material, where x is 0.1-0.9.

As a preferable scheme of the present invention, the cleaning process in step 2 comprises a RCA cleaning to remove surface contaminants on SiGe material before the SiGe material is dipped into hydrofluoric acid (HF) to remove native oxide from surface.

As a preferable scheme of the present invention, Al thin film has a thickness of 1 nm to 5 nm.

As a preferable scheme of the present invention, Ni layer has a thickness of 2 nm to 200 nm, which can be selectively determined, as eg. 10 nm, according to actual process requirements.

As a preferable scheme of the present invention, annealing is performed under conditions of an annealing temperature of 300° C. to 800° C., a duration of 5 s to 10 m, and an atmosphere of nitrogen, argon or a mixed gas of nitrogen and hydrogen.

The advantageous effects of the present invention are that:

(1) The introducing of an Al interlayer to block Ge atoms during processing ensures a consistent reaction sequence of Ni with Si and Ge atoms, facilitating the formation of a continuous and flat NiSiGe thin film and thereby greatly enhancing interface performance;

(2) The Al interlayer also prevents Ge atoms from diffusing into NiSiGe layer, enhancing the electrical performance of NiSiGe thin film and thereby beneficial to the NiSiGe thin film used as source and drain contact.

DETAILED DESCRIPTION OF THE EMBODIMENTS

Specific implementation steps of the present invention are further detailed below with reference to the accompanying drawings, which are not drawn to scale for convenience of illustration.

Embodiment 1

Figure 1:
FIG. 1-4 are schematic views of corresponding product structures during the implementation of the present invention.

As shown in FIG. 1, this embodiment starts with the preparation of a $Si_xGe_{1-x}$ material layer, which can be directly formed on Si substrate to form SiGe material with compressive strain, or be grown using buffer layer process to form relaxed SiGe material, where x is 0.1.

Upon the preparation of $Si_xGe_{1-x}$ material layer, it is cleaned according to the following two steps:

Clean SiGe material by standard RCA (Radio Corporation of America) cleaning to remove surface contaminants;

Dip SiGe material into HF to remove native oxide from surface.

Figure 2:
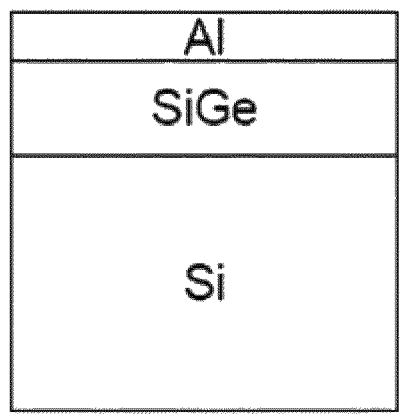

After cleaning, deposit an Al thin film of a thickness of 1 nm on the surface of SiGe material layer, as shown in FIG. 2.

Figure 3:
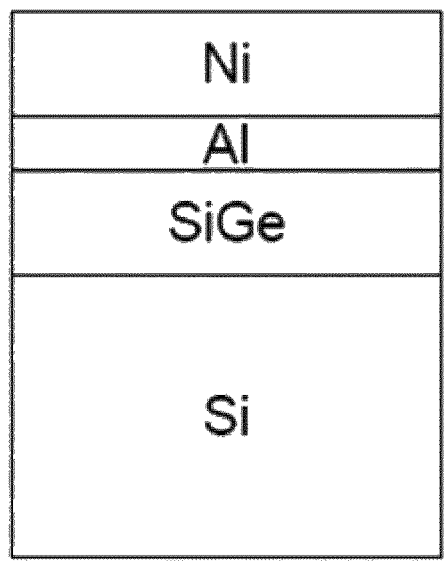

Next, deposit a Ni layer on Al thin film, as shown in FIG. 3. The Ni layer has a thickness of 2 nm.

Then, perform annealing process under conditions of an annealing temperature of 300° C., a duration of 5 s, and an atmosphere of nitrogen.

Al atoms first act as a barrier layer during the reaction between Ni and SiGe to regulate respective reaction rates of Ni with Si and Ge atoms, thereby balancing the reaction of Ni with Si and Ge atoms and preventing Ge atoms from diffusing; then, the presence of Al can adjust the lattice constant of NiSiGe, thereby allowing a good match between NiSiGe layer and SiGe substrate.

After the reaction of Al atoms, most of Al atoms appear on the surface of NiSiGe and form a layer of Al oxide, substantially having little influence on the performance of NiSiGe layer.

Figure 4:

An epitaxial layer of NiSiGe can be obtained by selective etch to remove Ni that hasn't reacted with SiGe material, as shown in FIG. 4.

Due to the barrier effect of Al interlayer, NiSiGe layer features a single crystal structure, a flat interface with SiGe substrate and a thickness of up to 0.3 nm, significantly enhancing interface performance.

Embodiment 2

Basic steps are as that of embodiment 1 with x of 0.9 for $Si_xGe_{1-x}$ material layer, a thickness of 5 nm for Al thin film and a thickness of 200 nm for Ni layer.

The annealing process is performed under conditions of an annealing temperature of 800° C., a duration of 10 m, and an atmosphere of argon.

Embodiment 3

Basic steps are as that of embodiment 1 with x of 0.3 for $Si_xGe_{1-x}$ material layer, a thickness of 2 nm for Al thin film and a thickness of 10 nm for Ni layer.

The annealing process is performed under conditions of an annealing temperature of 500° C., a duration of 1 m, and an atmosphere of a mixed gas of nitrogen and hydrogen.

The key of the present invention is the improvement of conventional fabrication process of contact material layer, making it possible for NiSiGe thin film to be widely used for source and drain contact.

In the present invention, the thickness of Al thin film and Ni layer, the ambient conditions of annealing process and relevant parameters can all be adjusted according to the requirements of actual conditions, and steps, of such as annealing and selective etch, can adopt universal processes in the field.

Other technologies involved in the present invention belong to the field those skilled in the art are familiar with and as such will not be discussed herein. The description of foregoing embodiments is only used to describe but not to limit the present invention. Any technical scheme within the spirit and scope of the present invention shall be included in the scope of the claims of the present invention.

What is claimed is:

1. A method of NiSiGe epitaxial growth by introducing Al interlayer, comprising the following steps:
   Step 1, form a SiGe layer on a semiconductor Si substrate;
   Step 2, clean SiGe layer to remove contaminants and native oxide from surface;
   Step 3, deposit an Al thin film on the surface of SiGe layer;
   Step 4, deposit a Ni layer on Al thin film;
   Step 5, perform annealing process for the reaction between Ni layer and SiGe material of SiGe layer to form NiSiGe material;
   Step 6, remove unreacted Ni by selective etch to get a NiSiGe epitaxial layer on the surface of SiGe layer.

2. The method of NiSiGe epitaxial growth by introducing Al interlayer according to claim 1, wherein said SiGe layer in step 1 is directly formed on Si substrate to form SiGe layer with compressive strain.

3. The method of NiSiGe epitaxial growth by introducing Al interlayer according to claim 1, wherein said SiGe layer in step 1 is grown using buffer layer process to form relaxed SiGe layer.

4. The method of NiSiGe epitaxial growth by introducing Al interlayer according to claim 2 or 3, wherein said SiGe layer employs $Si_xGe_{1-x}$ material, where x is 0.1-0.9.

5. The method of NiSiGe epitaxial growth by introducing Al interlayer according to claim 1, wherein the cleaning process in step 2 comprises a RCA cleaning of SiGe material to remove surface contaminants before the SiGe material is dipped into HF to remove native oxide from surface.

6. The method of NiSiGe epitaxial growth by introducing Al interlayer according to claim 1, wherein said Al thin film has a thickness of 1 nm to 5 nm.

7. The method of NiSiGe epitaxial growth by introducing Al interlayer according to claim 1, wherein said Ni layer has a thickness of 2 nm to 200 nm in step 4.

8. The method of NiSiGe epitaxial growth by introducing Al interlayer according to claim 1, wherein the annealing is performed under conditions of an annealing temperature of 500° C. to 800° C., a duration of 5 s to 10 m, and an atmosphere of nitrogen, argon or a mixed gas of nitrogen and hydrogen.

* * * * *